United States Patent [19]

Sylvestro et al.

[11] Patent Number: 5,565,035
[45] Date of Patent: Oct. 15, 1996

[54] FIXTURE FOR MASKING A PORTION OF AN AIRFOIL DURING APPLICATION OF A COATING

[75] Inventors: Joseph A. Sylvestro, New Britain; Conan P. Cook, Tolland, both of Conn.

[73] Assignee: United Technologies Corporation, Hartford, Conn.

[21] Appl. No.: 616,031

[22] Filed: Mar. 14, 1996

[51] Int. Cl.[6] ............................................. C23C 16/00
[52] U.S. Cl. ..................... 118/721; 118/301; 118/504; 118/505; 118/720
[58] Field of Search .................... 118/213, 301, 118/504, 505, 500, 720, 721, 728

[56] References Cited

U.S. PATENT DOCUMENTS

| | | | |
|---|---|---|---|
| 3,668,913 | 6/1972 | Morris | 72/53 |
| 4,530,861 | 7/1985 | Sippel et al. | 427/444 |
| 4,919,076 | 4/1990 | Lutz | 118/721 |

FOREIGN PATENT DOCUMENTS

| | | | |
|---|---|---|---|
| 62-146254 | 6/1987 | Japan | 118/720 |
| 62-164866 | 7/1987 | Japan | 118/720 |
| 62-164867 | 7/1987 | Japan | 118/720 |
| 797917 | 1/1981 | U.S.S.R. | 118/504 |

*Primary Examiner*—Robert Kunemund
*Assistant Examiner*—Jeffrie R. Lund
*Attorney, Agent, or Firm*—Granetta M. Coleman

[57] ABSTRACT

The present invention relates to an improved fixture (70) for masking a portion of an airfoil (12) during coating operations. The fixture (70) includes a masking member (54) and a clamp (74) for forcing the masking member (54) into contact with the portion of the airfoil (12) requiring masking.

16 Claims, 5 Drawing Sheets

FIG.5A
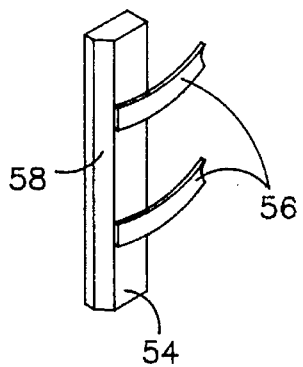
FIG.5B
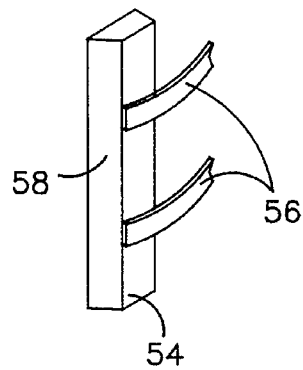
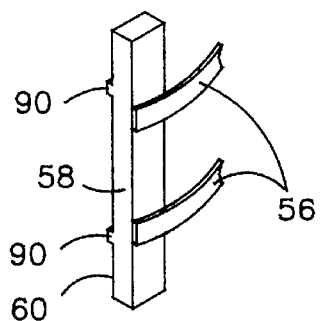
FIG.5C
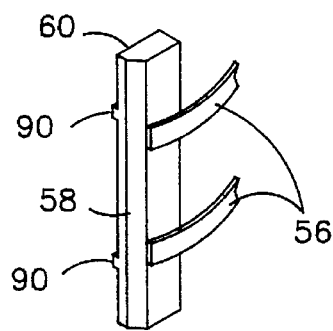
FIG.5D
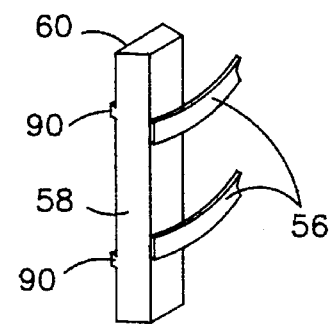
FIG.5E 5,565,035

FIXTURE FOR MASKING A PORTION OF AN AIRFOIL DURING APPLICATION OF A COATING

TECHNICAL FIELD

The present invention relates to coating airfoils, and more particularly to a fixture for masking a portion of an airfoil during coating.

BACKGROUND OF THE INVENTION

Conventional gas turbine engines, typically have a turbine section for extracting work from working medium gases. The turbine section generally includes airfoils, such as rotating blades and stationary vanes. It is industry practice to protect turbine airfoils from oxygen, sulfur, and high temperatures, which the airfoils encounter during normal engine operation, using coatings. Since coatings preserve the integrity of the airfoils, coatings improve the service life of airfoils, and allow the airfoils to operate at optimum temperatures.

Packed, plasma spray, and physical vapor deposition are conventional processes for applying coatings to airfoils. During these coating processes, portions of the airfoils require masking or shielding from the coating. For example, a trailing edge of some airfoils requires masking from ceramic coatings. Ceramic coatings will insulate the trailing edge from cooling air, and potentially cause trailing edge distress in service. Trailing edge distress includes a variety of phenomenon, such as oxidation, erosion and cracking, which lead to performance losses while the blade is in service. If the distress is substantial, the blade will not be repairable during overhaul, and the blade is not returned to service.

Several possible methods for masking the trailing edge of airfoils during coating have been sought. One possible method for masking the trailing edge of a part requires applying a metallic tape to the area where the coating is undesirable. Due to the high temperatures employed during coating, the tape tends to burn away unpredictably. Since the tape burns late in the process, the tape only initially protects the vulnerable areas, but using tape is not the optimum solution for several other reasons. First, because the tape burns unpredictably, tape is unsuitable in a production environment where consistent results are imperative. Second, the use of tape is effective only for certain coatings and certain application processes. For example, when using the physical vapor deposition process, tape cannot be used, because the tape and the coating can interact on the molecular level during the process. This interaction can prevent the coated airfoil from having the required properties.

Another possible method for masking the airfoils uses a fixture. The fixture for use with a vane includes two enclosures, a masking member, a supporting slat, and a connecting member. Each enclosure surrounds and protects portions of the vanes from coating. The supporting slat attaches the enclosures to one another. The connecting member fixes the masking member to the supporting slat. The masking member is typically in a fixed position spaced from the trailing edge of the airfoil, thus defining a gap between the masking member and one surface of the airfoil. Since there is a gap between the masking member and the surface of the airfoil, coating particles can enter this gap and adhere to the trailing edge during coating. One solution that temporarily decreases coating on the trailing edge is bending the connecting member. This decreases the gap, which consequently decreases the amount of coating on the trailing edge. However, this solution is temporary, and coating begins to build up due to movement of the masking member resulting from vibrations caused by the coating process and/or the thermal growth experienced by the fixture as its temperature increases during coating.

When the fixture undergoes vibration and/or thermal changes, the masking member can come into repeated contact with the vane, which can cause removal of existing coating or wear of the vane. Removal of existing coating exposes the vane, during use, to the harsh engine environment, and leads to the airfoil being damaged in service. Wear of the vane itself can create crack initiation sites that might grow in service. Both removal of existing coating or wear of the vane are unacceptable, because they can reduce the engine performance and vane service life.

In addition, when the fixture undergoes vibration and/or thermal changes, the masking member can move away from the surface of the vane, or out of alignment with the trailing edge of the vane. Such displacement of the masking member can allow the coating particles to contact and adhere to the trailing edge more easily. Sometimes grit, vapor or water blasting can remove undesired coating along the trailing edge, but such coating removal operations may add significantly to the cost of the overall coating operation. In other cases where undesired coating cannot be removed, the coating can cause trailing edge distress in service. Trailing edge distress can lead to performance losses and decreases the service life of the airfoil, both of which result in significant costs.

Furthermore, using the prior art fixture can result in the masking member and the airfoil joining due to coating spanning these two parts and drying. This joining, known as bridging, is undesirable because separation of the masking member from the airfoil under such conditions can cause damage to the coating, as well as the airfoil. Damage to either can lead to performance losses and decreases in the service life of the airfoil.

Therefore, an improved fixture is sought, which effectively masks a portion of the midspan region of an airfoil during coating, which does not wear away existing coating or create crack initiation sights, which is inexpensive to manufacture, which is suitable for a production environment, and which minimizes bridging.

SUMMARY

According to the present invention, a fixture for masking a portion of an airfoil during coating includes a masking member and a clamp. The clamp eliminates a gap between the airfoil and the masking member by forcing the masking member into contact with the portion of the airfoil requiring masking. This minimizes the likelihood of coating contacting and adhering to areas of the airfoil where the coating is undesirable. The constant contact also decreases the probability that the masking member will remove existing coating or wear the vane.

According to a particular embodiment of the fixture of the present invention, the fixture includes a base, a masking member, and a clamp. The clamp includes a supporting rod being connected to the base, a connecting member fixing the masking member to the supporting rod, and biasing means for forcing the masking member into contact with the vane.

According to another particular embodiment of the fixture, the biasing means further includes an arm and a spring.

The arm attaches to one end of the supporting rod, and the spring connects the arm to the base.

BRIEF DESCRIPTION OF THE DRAWING

FIGS. 5a–e are enlarged perspective views of several embodiments of a modified masking member for use with the fixture shown in FIG. 4.

BEST MODE FOR CARRYING OUT AN EMBODIMENT OF THE INVENTION

Figure 1:
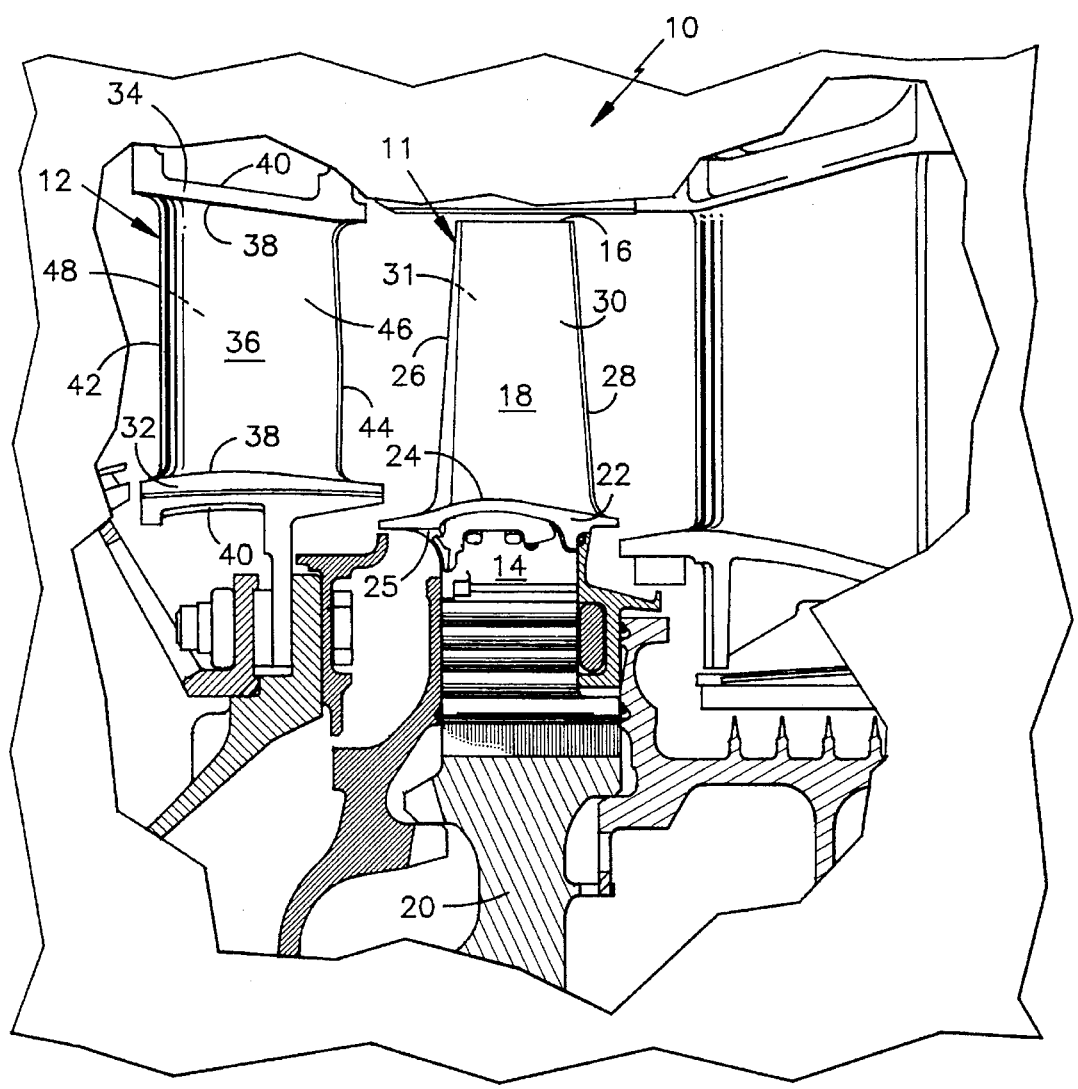
FIG. 1 is a partial sectional view of a turbine section of a gas turbine engine.

Referring to FIG. 1, the turbine section 10 of a typical gas turbine engine generally includes airfoils, represented by a rotating blade 11 and a stationary vane 12. Each blade 11 includes a root region 14, an opposed tip 16, and a midspan region 18 extending therebetween. The root region 14 engages a rotor disk 20. A platform 22 separates the root region 14 from the midspan region 18. The platform 22 forms a radially inner flow surface 24, and an opposed radially outer surface 25. The midspan region 18 of the blade is airfoil-shaped, and includes an upstream leading edge 26, and an opposed downstream trailing edge 28. The midspan region 18 further includes pressure and suction surfaces 30, 31. These surfaces 30, 31 extend between the edges 26, 28.

Each vane 12 includes two radially spaced platforms 32 and 34, and a midspan region 36 extending between the platforms. Each platform 32 and 34 form radially inner flow surfaces 38, and opposed radially outer surfaces 40. Similar to the blade 11, the midspan region 36 of the vane 12 is airfoil-shaped, and includes a leading 42, a trailing edge 44, a pressure surface 46, and a suction surface 48.

Figure 2:
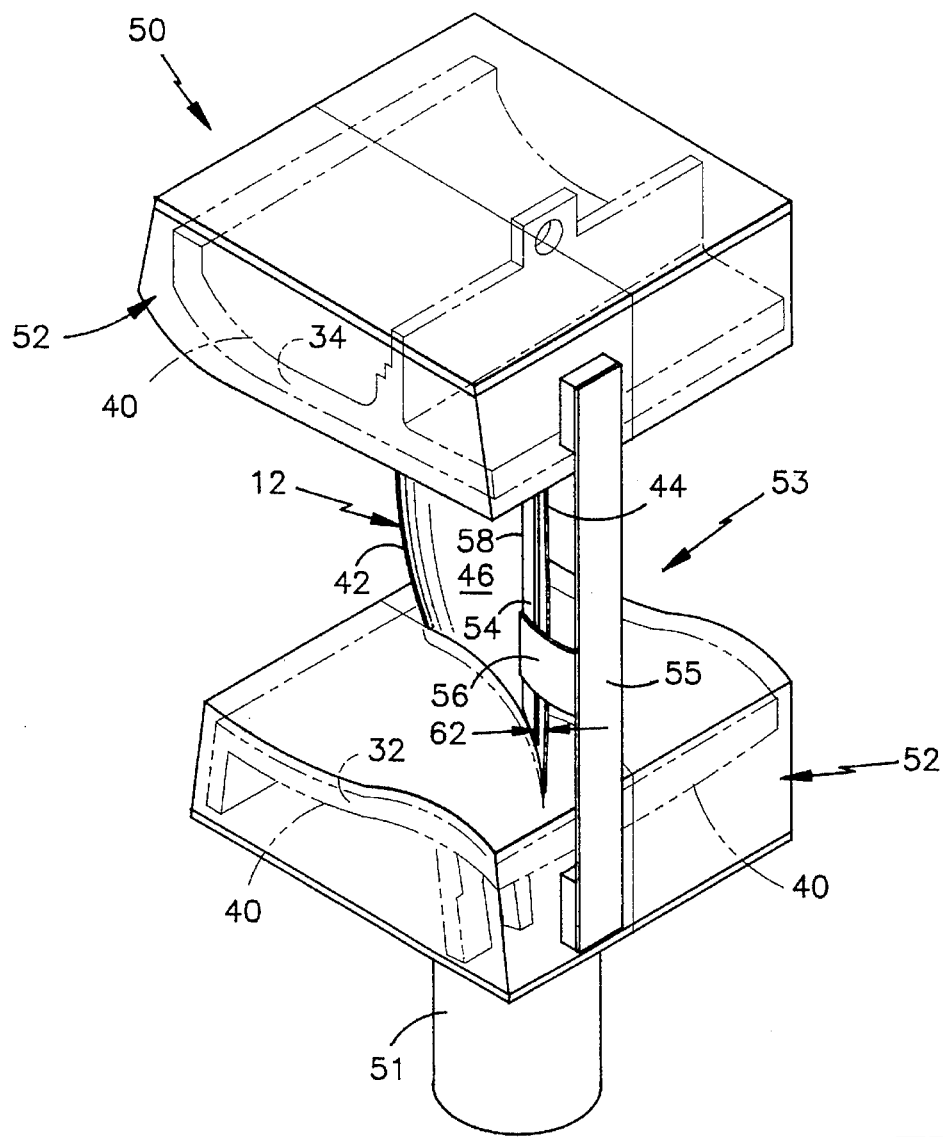
FIG. 2 is a perspective view of a prior art airfoil masking fixture having a vane disposed therein.
Figure 3:
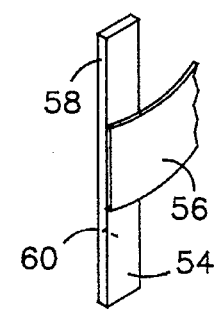
FIG. 3 is a perspective view of a prior art masking member employed in the fixture shown in FIG. 2.

Referring to FIGS. 2 and 3, the prior art fixture 50 includes an attachment means 51, two enclosures 52, a masking member 54, a supporting slat 55, and a connecting member 56. The attachment means 51 connects the fixture 50 to a shaft (not shown) within a coating apparatus (also not shown). The enclosures 52 function as the base of the fixture 50 and supports the vane and protects the radially outer surfaces 40 of the platforms 32 and 34 (shown in phantom) from the coating spray. The supporting slat 55 connects the enclosures 52 to one another. The connecting member 56 fixes the masking member 54 to the supporting slat 55. The components set forth hereinabove are typically formed from alloys such as AMS5544, AMS5536 or other materials resistant to high temperatures, chemical attack and alloy transfer. The components are attached to one another by welding, brazing or the like. When coating parts without platforms, the base of the fixture supports the part and may be for example a post that fits within the part, and the supporting slat connects to the base of the fixture.

Referring to FIG. 3, the masking member 54 has an edge 58 and surface 60. The edge 58 of the masking member is substantially flat and perpendicular to the pressure surface 46 of the vane. The surface 60 facing the airfoil is substantially flat. Referring to FIG. 2, as a result of manufacturing tolerances, the masking member 54 is in a fixed position spaced from the pressure surface 46 of the vane 12. Thus a gap 62 is defined between the surface 60 of the masking member and the pressure surface 46. As set forth hereinabove, during airfoil coating operations, thermal growth of the fixture can cause the gap 62 to increase allowing coating to enter and adhere to the trailing edge 44 of the vane or thermal growth can cause the gap 62 to decrease causing the removal of existing coating or wear of the vane.

Figure 4:
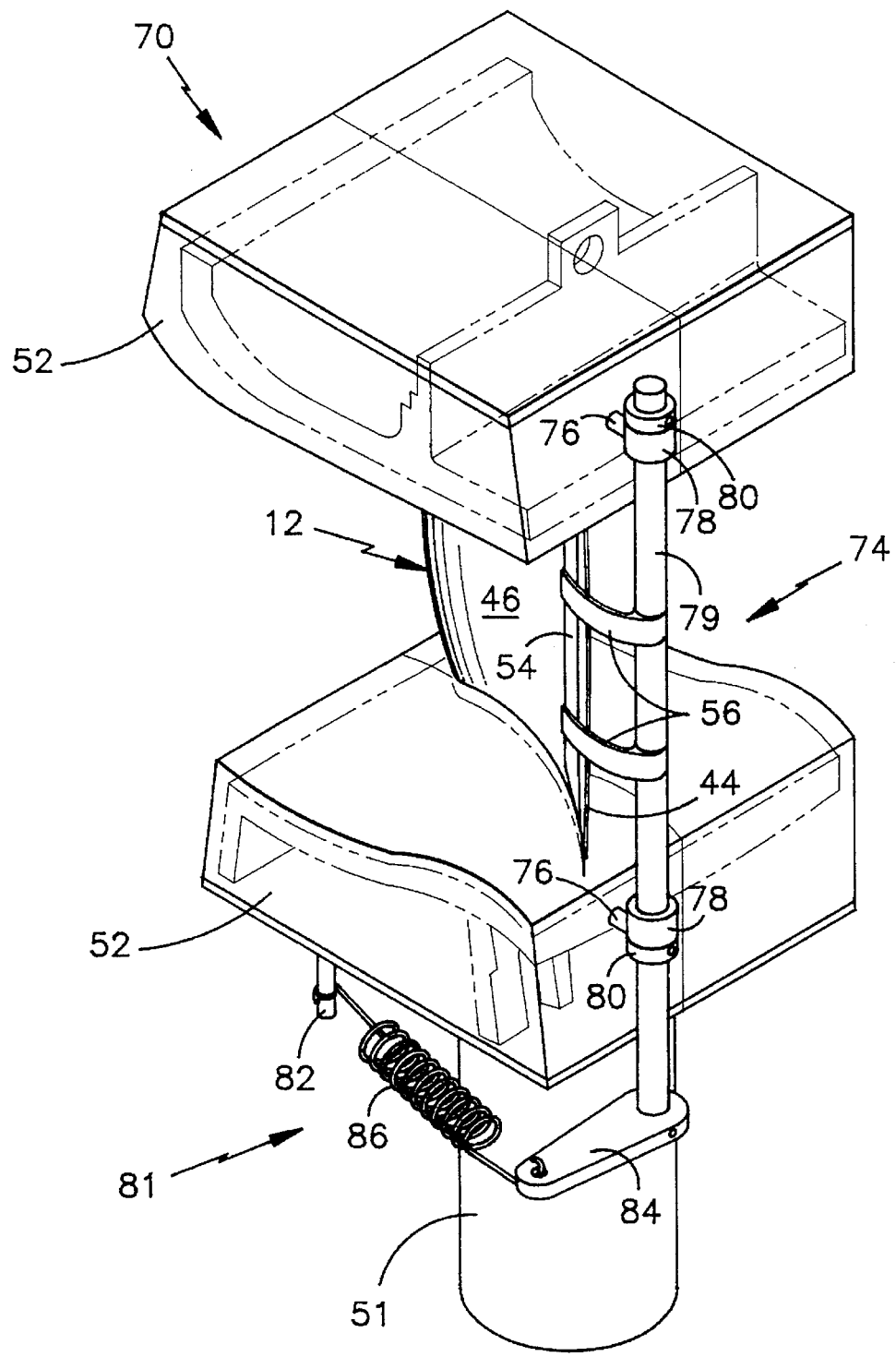
FIG. 4 is a perspective view of one embodiment of an improved airfoil masking fixture of the present invention having a vane disposed therein.

With reference to FIGS. 4 and 5, the improved fixture 70 of the present invention includes the enclosures 52, the masking member 54, and a clamp 74. Each enclosure 52 includes a post 76 and a support ring 78. Each post 76 extends from the associated enclosure 52. Each support ring 78 attaches to the free end of each associated post 76.

The clamp 74 includes a supporting rod 79, the connecting members 56, annular collars 80, and biasing means 81. The supporting rod 79 extends through the support rings 78, and is rotatable therein. The annular collars 80 are removably fastened to the supporting rod 79 at opposing ends thereof. The two, spaced connecting members 56 fix the masking member 54 to the supporting rod 79. Use of two connecting members improves the stability of the masking member during the coating process, thus making the fixture more robust. This stability results from the two connecting members 56 distributing the force and moment created by the spring rather than allowing it to be born by a single such member. In addition, this stability results from the two members creating a rectangular structure, which is more stable.

The biasing means 81 includes a pin 82, an arm 84, and a spring 86. The pin 82 extends from one of the enclosures 52 away from the vane 12. The arm 84 attaches to the one end of the supporting rod 79. The spring 86 connects the arm 84 to the enclosure via the pin 82.

Once connected, the spring 86 biases the arm 84, pivots the supporting rod 79 and forces the masking member 54 into contact with the pressure surface 46 of the vane adjacent to the trailing edge 44, which eliminates the gap 62 (as shown in FIG. 2). When the fixture 70 experiences vibrations and/or thermal growth during the coating process, the spring 86 continues to force the masking member 54 into contact with the pressure surface 46 of the vane. As a result of the biasing means, the contact between the masking member 54 and the pressure surface 46 of the vane will be continuous throughout the coating process.

Referring to FIGS. 5a and b, the edge 58 of the masking member 54 has been modified, so that the edge 58 has a major portion that is beveled. When coating with plasma spray, it has been hypothesized that the likelihood of bridging will decrease the more obtuse the angle is defined between the edge of the masking member and the pressure surface of the vane. When this angle is obtuse it will require more coating material to link the masking member and the vane. Since using the beveled masking member makes the angle more obtuse it decreases the likelihood of bridging during plasma spray processes.

When coating using the vapor deposition process, a standard masking member 54 (as shown in FIG. 3) or a modified masking member 54 (as shown in FIGS. 5a and b) with an edge 58 with a major portion that is beveled will produce different results. It has been observed that the coating is not always uniformly applied during the vapor deposition process. That is, the pressure surface of the airfoil, which is concave in shape, is often coated with a thinner coating than the suction surface of an airfoil. The airfoil and standard masking member in combination are more concave than the airfoil and the modified masking member in combination and the airfoil alone. Since a more concave shape will decrease the amount of coating present near the interface between the masking member and the vane, using the standard masking member reduces the amount of coating at the interface the most. Thus, using the standard masking member with vapor deposition process will be most effective in reducing the likelihood of bridging. The appropriate masking member shape will depend on the coating thickness requirements at the interface and the need to prevent bridging.

Referring to FIGS. 5c–e, the surface 60 of the masking member 54 has been modified to include a plurality of protrusions 90. If the airfoil is provided with notches along the trailing edge to accommodate cooling air or the like, the protrusions 90 fit within several of the notches, and concentrate the loading of the masking member on the airfoil at discrete locations. Thus, minimizing the damage to the airfoil by contact with the masking member.

Figure 6A:
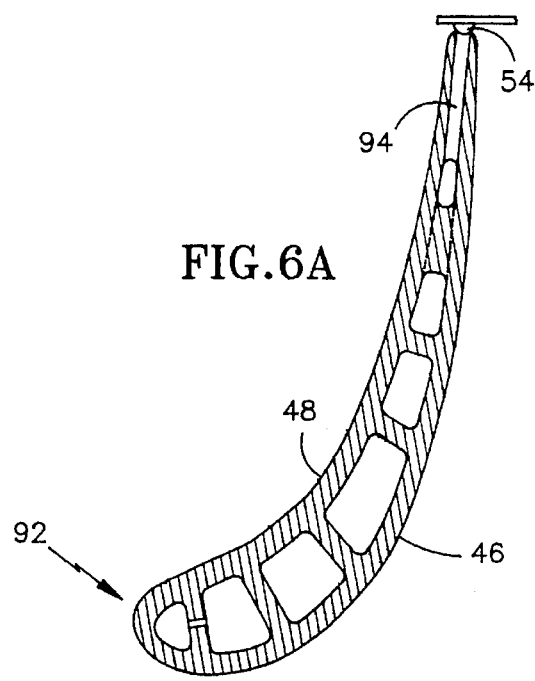
FIGS. 6a–c are sectional views of several other embodiments of the modified masking member for use with the fixture shown in FIG. 4.
Figure 6B:
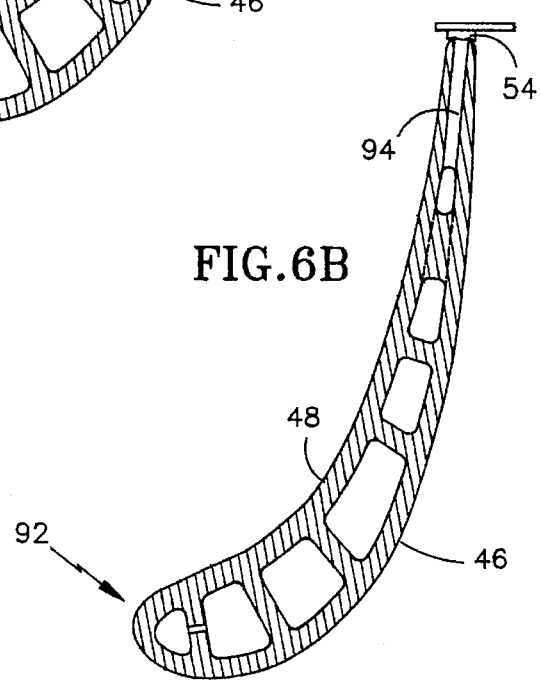
Figure 6C:
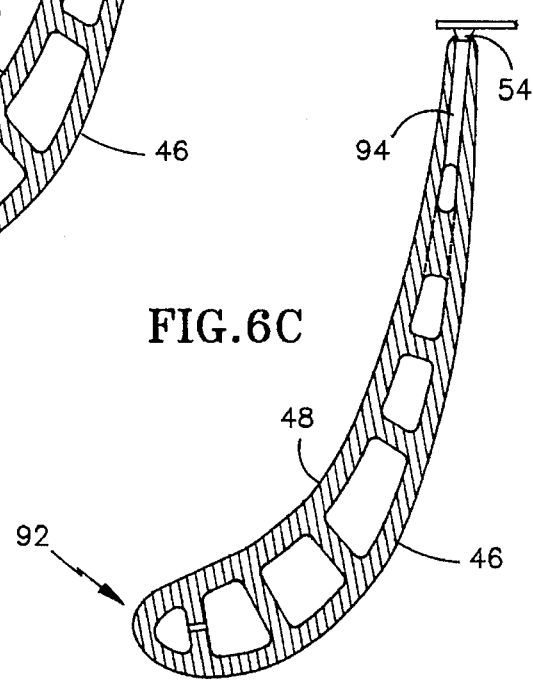

Now referring to FIGS. 6a–c, when an airfoil 92 includes a cooling channel 94 and the trailing edge does not have notches as described above, the fixture can be modified so that the reorientation of the vane in the fixture from the rotations there shown in FIG. 2, allows the masking member to prevent coating from entering the cooling channel 94. The masking member 54 can include a semi-circular, square or triangular cross-section. The shape of the cross-section of each masking member aids in effectively preventing the coating from entering the cooling channel 94 of the airfoil 92.

The principal advantage of the improved fixture is that undesirable application of coating to the masked portions of the airfoil decreases by minimizing the gap between the masking member and the airfoil. The gap is minimized by forcing the masking member into contact with the portion of the airfoil requiring masking.

A secondary advantage of the improved fixture is the spring minimizes movement of the masking member, thus limiting removal of coating from the vane and wear of the vane due to repeated contact between the masking member and the vane. The effects of contact between the masking member and the vane can be further reduced by modifying the geometry of the masking member to include protrusions. Other advantages of the improved fixture are that it is simple and inexpensive to manufacture, and robust. Yet another advantage of the improved fixture is that it minimizes bridging between the masking member and the airfoil due to varying the geometry of the masking member.

While the present invention has been described with reference to illustrated embodiments, various modifications of the illustrative embodiments, as well as additional embodiments of the invention, will be apparent to persons skilled in the art upon reference to this description without departing from the spirit and scope of the invention, as recited in the claims appended hereto. These modifications include but are not limited to using enclosures without the posts or using enclosures which replace the support rings and posts with holes through which the supporting rod extends. The orientation of the supporting rod and connecting members may be changed. Further, the clamp may be modified to replace the arm and spring with just a wire arm or a spring stiff enough to hold the masking member in contact with the vane without the arm. Further, the biasing means or spring may be grounded or anchored to another component aside from the pin or the pin may be moved to a different location, so long as the masking member is still forced into contact with the vane. In addition, although a cylindrical supporting rod is shown, this element may be any shape which allows the embodiment to function as required. Although the current fixture masks a portion of the midspan region of the vane the fixture can be modified so that the masking member shields any desired portion of the part. If the improved fixture is used with a blade, only one enclosure can be used to shield the root region of the blade, and the supporting rod will extend from the enclosure as a cantilevered beam. It is therefore contemplated that the appended claims will cover any such modification or embodiments that fall within the true scope of the invention.

We claim:

1. A fixture for use with an airfoil having a portion requiring masking, said fixture comprising a base for supporting the airfoil during coating, and a masking member; said fixture being characterized by:

a clamp including a supporting rod being connected to said base, a connecting member fixing the masking member to the supporting rod, so that the masking member is disposed along the portion of the airfoil requiring masking, and biasing means for forcing the masking member into contact with the portion of the airfoil requiring masking;

wherein said biasing means further includes an arm attached to one end of the supporting rod, and a spring connecting the arm to the base.

2. The fixture of claim 1, characterized by said biasing means being grounded to said base.

3. A fixture for use with an airfoil having at least one platform having a radially inner surface, a spaced radially outer surface, and a midspan region extending radially outward from the radially inner surface of the platform, the midspan region having a portion requiring masking, said fixture comprising a base for protecting the outer surface of the platform during coating, and a masking member; said fixture being characterized by:

a clamp including a supporting rod being connected to said base, a connecting member fixing the masking member to the supporting rod, so that the masking member is disposed along the portion of the midspan region requiring masking, and biasing means for forcing the masking member into contact with the portion of the midspan region requiring masking;

wherein said biasing means further includes an arm attached to one end of the supporting rod, and a spring connecting the arm to the base.

4. The fixture of claim 3, characterized by said biasing means being grounded to said base.

5. A fixture for use with a vane having two platforms, each platform having a radially inner surface, a spaced radially outer surface, and a midspan region extending radially outward from the radially inner surfaces of the platform, the midspan region having a portion requiring masking, said fixture comprising two enclosures for protecting the outer surface of the platforms during coating, and a masking member, said fixture being characterized by:

a clamp including a rotatable supporting rod being connected to said enclosures, at least two connecting members being spaced from one another fixing the masking member to the supporting rod, so that the masking member is disposed along the portion of the midspan region requiring masking, an arm being attached to one end of the supporting rod, and a spring connecting the arm to one of said enclosures, said spring forcing the masking member into contact with the portion of the midspan region requiring masking.

6. The fixture of claim 5, characterized by said masking member including an edge with portion that is beveled.

7. The fixture of claim 5, characterized by said masking member including a surface with at least one protrusion.

8. The fixture of claim 5, characterized by said masking member including a semi-circular cross-section.

9. The fixture of claim 5, characterized by said masking member including a square cross-section.

10. The fixture of claim 5, characterized by said masking member including a triangular cross-section.

11. A fixture for use with a blade having a platform having a radially inner surface, a spaced radially outer surface, and a midspan region extending radially outward from the radially inner surface of the platform, the midspan region having a portion requiring masking, said fixture comprising an enclosure for protecting the outer surface of the platform during coating, and a masking member, said fixture being characterized by:

a clamp including a rotatable supporting rod being connected to said enclosure, at least two connecting members being spaced from one another fixing the masking member to the supporting rod, so that the masking member is disposed along the portion of the midspan region requiring masking, an arm being attached to one end of the supporting rod, and a spring connecting the arm to said enclosure, said spring forcing the masking member into contact with the portion of the midspan region requiring masking.

12. The fixture of claim 11, characterized by said masking member including an edge with portion that is beveled.

13. The fixture of claim 11, characterized by said masking member including a surface with at least one protrusion.

14. The fixture of claim 11, characterized by said masking member including a semi-circular cross-section.

15. The fixture of claim 11, characterized by said masking member including a square cross-section.

16. The fixture of claim 11, characterized by said masking member including a triangular cross-section.

* * * * *